United States Patent
Ganwani et al.

(10) Patent No.: US 10,574,393 B1
(45) Date of Patent: Feb. 25, 2020

(54) PHASE-BASED CYCLIC REDUNDANCY CHECK VERIFICATION FOR WIRELESS COMMUNICATION

(71) Applicant: Marvell International Ltd., Hamilton (BM)

(72) Inventors: Vijay Ganwani, Pune (IN); Ankit Sethi, Pune (IN); Sudhir Srinivasa, Campbell, CA (US); Sih-Yu Lin, Newark, CA (US); Yui Lin, Palo Alto, CA (US)

(73) Assignee: NXP USA, Inc., Austin, TX (US)

(*) Notice: Subject to any disclaimer, the term of this patent is extended or adjusted under 35 U.S.C. 154(b) by 29 days.

(21) Appl. No.: 16/045,491

(22) Filed: Jul. 25, 2018

Related U.S. Application Data

(60) Provisional application No. 62/647,590, filed on Mar. 23, 2018.

(51) Int. Cl.
| | |
|---|---|
| *H04L 1/00* | (2006.01) |
| *G06F 11/10* | (2006.01) |
| *H03M 13/09* | (2006.01) |
| *H04W 28/04* | (2009.01) |
| *H04W 76/23* | (2018.01) |

(52) U.S. Cl.
CPC ........ *H04L 1/0061* (2013.01); *G06F 11/1004* (2013.01); *H03M 13/09* (2013.01); *H04L 1/0041* (2013.01); *H04W 28/04* (2013.01); *H04L 1/0026* (2013.01); *H04W 76/23* (2018.02)

(58) Field of Classification Search
CPC ... H04L 1/0061; H04L 1/0041; H04L 1/0026; G06F 11/1004; H03M 13/09; H04W 28/04; H04W 76/23
See application file for complete search history.

(56) References Cited

U.S. PATENT DOCUMENTS

| | | | | |
|---|---|---|---|---|
| 5,867,503 A | * | 2/1999 | Ohsuga | H03J 7/04 375/269 |
| 6,032,033 A | | 2/2000 | Morris et al. | |
| 6,647,077 B1 | * | 11/2003 | Shan | H04B 1/7113 370/206 |

(Continued)

OTHER PUBLICATIONS

"Non-Final Office Action", U.S. Appl. No. 15/097,026, dated Oct. 28, 2016, 6 pages.

(Continued)

*Primary Examiner* — Kyle Vallecillo

(57) ABSTRACT

The present disclosure describes methods and apparatuses for phase-based cyclic redundancy check (CRC) verification for wireless communication. In some aspects, a soft phase value and a sliced phase value are received for a symbol of a data packet, the data packet received via a wireless interface. An error measurement is determined for the symbol based on the soft phase value and the sliced phase value. The error measurement for the symbol is then compared to an error measurement threshold for detecting symbol-level errors in the data packet. Based on the error measurement exceeding an error measurement threshold, a bit error can be detected in the data packet, which may have passed CRC. By detecting the bit error despite a CRC pass, the bit error can be indicated to higher-level entity of the wireless interface. This can be effective to prevent the bit error from impairing operation of the higher-level entity.

20 Claims, 9 Drawing Sheets

(56) References Cited

U.S. PATENT DOCUMENTS

| | | | | |
|---|---|---|---|---|
| 6,700,929 | B1* | 3/2004 | Shan | H04B 1/7113 |
| | | | | 324/613 |
| 6,728,324 | B1* | 4/2004 | Shan | H04B 1/7107 |
| | | | | 375/346 |
| 6,947,504 | B1 | 9/2005 | Petit | |
| 8,804,691 | B1* | 8/2014 | Zhao | H04L 27/2659 |
| | | | | 370/350 |
| 9,491,017 | B1* | 11/2016 | Wang | H04L 27/22 |
| 9,699,011 | B1 | 7/2017 | Sethi et al. | |
| 2004/0037380 | A1* | 2/2004 | Shan | H04B 1/7107 |
| | | | | 375/346 |
| 2004/0131125 | A1* | 7/2004 | Sanderford, Jr. | H04L 5/06 |
| | | | | 375/261 |
| 2005/0272374 | A1* | 12/2005 | Lewis | H04L 27/2657 |
| | | | | 455/67.11 |
| 2006/0133291 | A1* | 6/2006 | Kim | H04L 1/0061 |
| | | | | 370/252 |
| 2006/0215778 | A1 | 9/2006 | Murthy et al. | |
| 2011/0069789 | A1* | 3/2011 | Xu | H04L 27/38 |
| | | | | 375/326 |
| 2016/0277177 | A1* | 9/2016 | de Ruijter | H04L 7/042 |

OTHER PUBLICATIONS

"Notice of Allowance", U.S. Appl. No. 15/097,026, dated Feb. 27, 2017, 8 pages.

\* cited by examiner

PHASE-BASED CYCLIC REDUNDANCY CHECK VERIFICATION FOR WIRELESS COMMUNICATION

CROSS REFERENCE TO RELATED APPLICATIONS

This present disclosure claims priority to U.S. Provisional Patent Application Ser. No. 62/647,590 filed Mar. 23, 2018, the disclosure of which is incorporated by reference herein in its entirety. This present disclosure is also related to U.S. Pat. No. 9,699,011, granted Jul. 4, 2017, the disclosures of which are incorporated by reference herein in their entireties.

BACKGROUND

Computing and electronic devices are often capable of wirelessly communicating with other devices or over networks to exchange data and/or access various resources. These devices typically include a wireless transceiver for transmitting and receiving data packets that are communicated through wireless connections with the other devices and networks. When received, the data packets are processed and decoded by the wireless transceiver to extract the data for use by applications of the receiving device. In some cases, conditions of an environment in which a device communicates degrade signal quality of the data packets, which can impair decoding of the data and result in data errors. For example, data packets received over large distances or through a noisy environment (e.g., interference) may have a low signal-to-noise ratio. To ensure that the data packets are correctly decoded, many wireless transceivers implement error detection codes to verify integrity of the received data.

These error detection codes, however, may falsely or incorrectly indicate that a data packet with a bit error is received error-free. This false indication of data integrity can result in the forwarding of data packets with bit errors to higher-level applications associated with wireless transceiver, the operation of which is impaired by the bit errors. In some cases, the higher-level applications enter an unrecoverable state due to the bit errors of the data packets that are passed by the error detection codes with a false pass indication. As such, the passing of data packets with bit errors through the error detection codes can result in data loss or user frustration when the higher-level applications are forced to restart to resume operation.

SUMMARY

This summary is provided to introduce subject matter that is further described in the Detailed Description and Drawings. Accordingly, this Summary should not be considered to describe essential features nor used to limit the scope of the claimed subject matter.

In some aspects, a method is implemented by a cyclic redundancy check (CRC) verifier to receive a soft phase value of a symbol of a data packet and a sliced phase value of the symbol of the data packet. An error measurement is determined for the symbol based on the soft phase value of the symbol and the sliced phase value of the symbol. The CRC verifier then compares the error measurement for the symbol to an error measurement threshold configured to detect bit errors in the data packet. Based on the error measurement exceeding an error measurement threshold, the CRC verifier can detect a bit error in the data packet, which may also falsely pass CRC operations. By so doing, the bit error can be indicated to a higher-level entity (e.g., Bluetooth profile) of a wireless interface that relies on data decoded from the data packet. In some cases, this can be effective to prevent the bit error of the data packet from impairing operation of the higher-level entity (e.g., an unrecoverable error).

In other aspects, a System-on-Chip (SoC) comprises a wireless communication controller to receive data packets and a receive chain to process the data packets, the receive chain including a phase differentiator circuit and a phase slicer circuit. The SoC also includes a CRC verifier that is implemented at least partially in hardware. The CRC verifier is configured to receive, from the phase differentiator circuit, a soft phase value of a symbol of a data packet and receive, from the phase slicer circuit, a sliced phase value of the symbol of the data packet. The CRC verifier then determines an error measurement for the symbol based on the soft phase value and the sliced phase value and compares the error measurement for the symbol to an error measurement threshold for detecting bit errors in the data packet. Based on the error measurement for the symbol exceeding the error measurement threshold, the CRC verifier may detect a bit error in the data packet, which may have falsely or incorrectly passed CRC operations. By so doing, the bit error can be indicated to a higher-level entity of the wireless communication controller that relies on data decoded from the data packet. In some cases, this can be effective to prevent the bit error of the data packet from impairing operation of the higher-level entity.

In yet other aspects, a computer-readable storage media comprises instructions that, responsive to execution by a hardware-based processor, implement a CRC verifier. The CRC verifier receives, from a phase differentiator of a wireless transceiver, a soft phase value of a symbol of a data packet. The CRC verifier also receives, from a phase slicer of the wireless transceiver, a sliced phase value of the symbol of the data packet. An error measurement for the symbol is determined based on the soft phase value and the sliced phase value. The CRC verifier is implemented to compare the error measurement for the symbol to an error measurement threshold for detecting symbol-level errors in the data packet. Based on the error measurement for the symbol exceeding the error measurement threshold, the CRC verifier can detect a bit error in the data packet, which may falsely or incorrectly pass CRC operations of the wireless transceiver.

The details of one or more implementations are set forth in the accompanying drawings and the following description. Other features and advantages will be apparent from the description and drawings, and from the claims.

BRIEF DESCRIPTION OF THE DRAWINGS

The details of one or more implementations of phase-based cyclic redundancy check (CRC) verification for wireless communication are set forth in the accompanying figures and the detailed description below. In the figures, the left-most digit of a reference number identifies the figure in which the reference number first appears. The use of the same reference numbers in different instances in the description and the figures indicates like elements.

DETAILED DESCRIPTION

Figure 1:
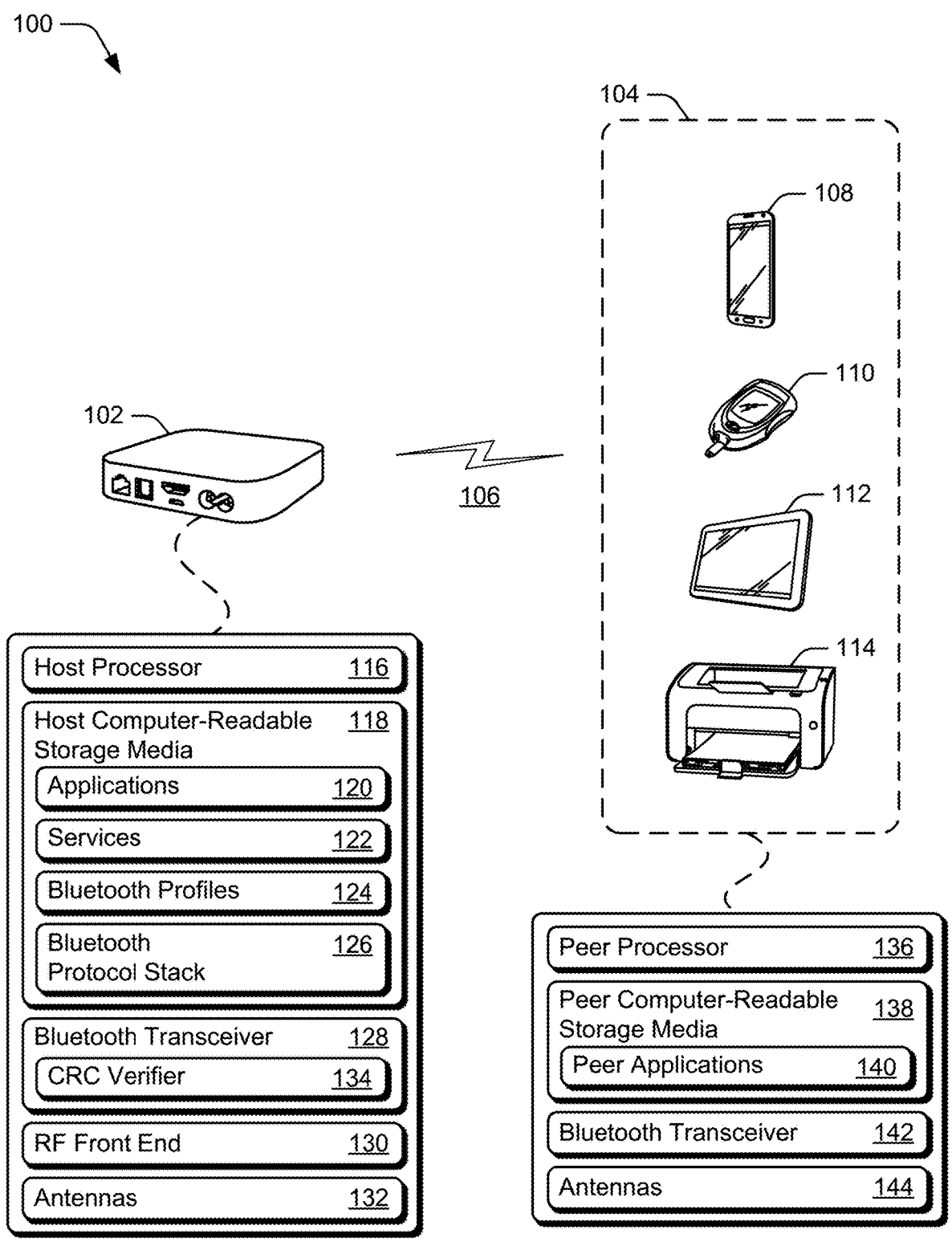
FIG. 1 illustrates an example operating environment that includes wireless devices implemented in accordance with one or more aspects.

Conventional techniques for detecting bit errors in received data packets often rely on an error-detecting code or algorithm for data verification. These error-detecting codes, however, may falsely or incorrectly indicate that a data packet with bit errors is received error-free. For example, a cyclic redundancy check (CRC) polynomial used in Bluetooth communication may use a 16-bit polynomial algorithm that is capable of detecting over 99% of bit errors in a data packet. Despite this success rate, the CRC polynomial algorithm is still unable to detect a small percentage of bit errors and may indicate a false CRC pass for these data packets that actually include a bit error. This false CRC pass indication can result in the data packets with bit errors being forwarded to higher-level layers of a software stack associated with a wireless transceiver. When these higher-level layers, such as a Bluetooth profile layer, attempt to process or use the data packet, operation of the higher-level layer can be impaired by the bit errors in the data. In some cases, the higher-level layer enters an unrecoverable state due to the bit errors of the data packet with a false CRC pass indication. As such, the false passing of data packets through the error-detecting codes can result in data loss or user frustration when the higher-level layers are forced to restart in order to recover from the bit errors and resume normal operation.

This disclosure describes techniques and apparatuses for phase-based cyclic redundancy check (CRC) verification for wireless (e.g., Bluetooth) communication. Throughout the description, the techniques and apparatuses for phase-based CRC verification are described in the context of Bluetooth communication for illustrative purposes. It should be noted that the techniques and apparatuses described herein apply equally to other wireless communication systems. Generally, these techniques and apparatuses may use phase values associated with symbols or bit groups of a data packet to verify data integrity of data packets. In some cases, the techniques detect a bit error in a data packet that passes CRC or other error-detecting algorithms. By so doing, the bit error of the data packet can be indicated to a higher-level entity, such as to prevent the data packet from compromising operation of the higher-level entity. For example, a device with a wireless receiver (or transceiver), such as a Bluetooth receiver, can implement phase-based CRC verification when pairing or communicating with another transceiver of a different device. Because aspects of phase-based CRC verification enable the wireless receiver to detect bit errors in data packets that normally pass CRC, these packets can be discarded before being forwarded to other layers of a software or protocol stack of the device. This in turn improves wireless interface performance because the layers of the software or protocol stack are prevented from attempting to process data with bit errors, which may lead to unrecoverable operational states, data loss, or user frustration.

In various aspects of phase-based CRC verification for wireless communication, a soft phase value of a symbol of a data packet is received from a phase differentiator of a wireless transceiver. A sliced phase value of the symbol of the data packet is also received from a phase slicer of the wireless transceiver. An error measurement is determined for the symbol based on the soft phase value of the symbol and the sliced phase value of the symbol. The error measurement for the symbol is then compared to an error measurement threshold configured to detect symbol-level errors in the data packet. Based on the error measurement exceeding an error measurement threshold, a bit error is detected in the data packet, which may have also passed CRC operations. By so doing, the bit error can be indicated to a higher-level entity (e.g., Bluetooth profile) of a wireless interface that relies on data decoded from the data packet. In some cases, this can be effective to prevent the bit error of the data packet from impairing operation of the higher-level entity (e.g., an unrecoverable error).

These and other aspects described herein may be implemented to provide phase-based CRC verification in which bit errors are detected in data packets that pass CRC operations. In some cases, the bit errors are detected at a symbol-level based on an error measurement that is computed by measuring a distance between a sliced phase value and a soft phase value of symbols in a data packet. In other cases, bit errors are detected at a bit-level based on an error measurement computed as a difference between phase values and compensated phase values for groups of bits of a data packet. When an error measurement exceeds an error measurement threshold, a count value can be incremented for symbols or bit groups that are indicated to include a bit error. Based on the count value, a bit error in the data packet can be detected when the count value exceeds a count threshold, such as an average threshold or configurable threshold for bit error detection. Additionally, an indication (e.g., false CRC pass bit) can be provided to a higher-level layer of a software stack or wireless interface to indicate that a data packet includes a bit error despite passing CRC. In such cases, the wireless interface can discard the data packet with the bit error to prevent the data packet from impairing operations of the higher-level layer of the software stack.

The following discussion describes an operating environment, techniques that may be employed in the operating environment, and a System-on-Chip (SoC) in which components of the operating environment can be embodied. In the context of the present disclosure, reference is made to the operating environment by way of example only.

Operating Environment

FIG. 1 illustrates an example operating environment 100 that includes a host device 102 and peer devices 104 that are implemented in accordance with one or more aspects. Each of these devices may be wireless-network-enabled and capable of communicating data, packets, and/or frames over a wireless connection 106, such as a Bluetooth personal area network (PAN). The PAN may operate in accordance with various Bluetooth standards. Example Bluetooth standards can include various versions of the core specification and/or respective data transport provisions including basic data rate (BDR), enhanced data rate (EDR), or Bluetooth low-energy (BLE). Alternately or additionally, the wireless connection 106 or other wireless connections of the devices may be implemented as a wireless local area network (WLAN) that may operate in accordance with various Institute of Electronics and Electrical Engineers (IEEE) 802.11 standards that may include 802.11n, 802.11ac, 802.11ad, 802.11ax, and the like, a peer-to-peer network, a mesh network, or a cellular network, such as a 3rd Generation Partnership Project Long-Term Evolution (3GPP LTE) network.

In this example, the host device 102 is embodied as a set-top box that is capable of communicating over wireless networks that include the wireless connection 106. In other cases, the host device 102 may include or be embodied as a mobile device, smart-phone, tablet computer, laptop computer, broadband router, drone controller, gaming controller, vehicle-based computing system, smart appliance, camera, printer, or network-enabled device. The peer devices 104 of the example environment 100 include a smart-phone 108, medical device 110, tablet computer 112, and wireless printer 114. Although not shown, other configurations of the peer devices 104 are also contemplated, such as a key fob, security system, drone, wearable smart-device, Internet-of-Things (IoT) device, gaming device, personal media device, navigation device, mobile-internet device (MID), network-attached-storage (NAS) drive, mobile gaming console, and so on.

Generally, the host device 102 and the peer devices 104 communicate via the wireless connection 106 to exchange data, provide services, or access resources made available by respective ones of the devices. In some cases, services or resources of the devices are provide or accessed in accordance with respective Bluetooth profiles that facilitate data access between devices. These profiles may include an advanced audio distribution profile (A2DP), attribute profile (ATT), audio/video remote control profile (AVRCP), basic imaging profile (BIP), basic printing profile (BPP), common integrated services digital network (ISDN) access profile (CIP), cordless telephony profile (CTP), device identification profile (DIP), or the like. As such, the host device 102 and peer devices 104 may exchange data packets over the wireless connection 106 in association with providing or accessing services through any suitable Bluetooth profile and/or data protocol (e.g., BDR, EDR, or BLE).

The host device 102 includes a processor 116 configured to execute processor-executable instructions and computer-readable storage media 118 (CRM 118). In some cases, the processor 116 is implemented as an application processor (e.g., multicore processor) or baseband processor to manage operation and connectivity of the host device 102. Alternately or additionally, the processor 116 can be implemented as a processor core, microcontroller, or digital signal processor (DSP). The CRM 118 of the host device 102 may include any suitable type and/or combination of storage media, such as read-only memory (ROM), random access memory (RAM), or Flash memory. In the context of the disclosure, the CRM 118 of the host device 102 is implemented as storage media, and thus does not include transitory signals or carrier waves. The CRM 118 may store firmware or an operating system of the host device 102 as instructions that are executed by the processor 116 to implement various functionalities of the host device 102.

In this example, applications 120, services 122, Bluetooth profiles 124, and a Bluetooth protocol stack 126 of the host device 102 are embodied on the CRM 118. The applications 120 and services 122 may include user applications and services that enable a user to interact with data or functionalities of the host device 102, such as media streaming, telephony, imaging, printing, or the like. To do so, the applications 120 or services 122 may utilize the Bluetooth profiles 124 and Bluetooth protocol stack 126 to communicate data or other information associated with a respective application or service. For example, an audio streaming service may utilize an advanced audio distribution profile (A2DP) to stream audio data packets to a remote speaker or wireless headset. Although described with reference to Bluetooth services or profiles, the CRM 118 may include software or protocol stacks of other types of wireless interfaces, such as a WLAN interface, mesh network interface, cellular interface, or the like.

The host device 102 also includes a Bluetooth transceiver 128, radio frequency (RF) front end 130, and antennas 132 for communicating with the peer devices 104 or communicating with other wirelessly-enabled devices. Although not shown, the host device 102 may include other types of wireless transceivers through which phase-based bit error detection can be implemented. The Bluetooth transceiver 128 may include any suitable configuration of respective communication paths (e.g., transmit or receive chains) to support transmission or reception of data packets via the wireless connection 106. Functionalities of the Bluetooth transceiver 128 can be managed or accessible through a communications controller or baseband processor, which may be implemented with or separately from a CRC verifier 134. The RF front-end 130 may include a low-noise amplifier, narrow-band filers, and switches or diplexers to couple or connect the Bluetooth transceiver 128 (e.g., RF ports) to the antennas 132 to facilitate various types of wireless communication. The antennas 132 of the host device 102 may include an array of multiple antennas that are configured similar to or differently from each other.

The CRC verifier 134 of the host device 102 can be implemented to perform various functions associated with phase-based bit error detection and/or indication, such as phase measurement, error measurement, threshold configuration, symbol error counting, and so on. For example, the CRC verifier 134 may receive respective soft phase values and sliced phase values for symbols of a data packet received via the Bluetooth transceiver 128. The CRC verifier 134 can determine error measurements for the symbols based on the respective soft phase values and sliced phase values of the symbols. Based on the error measurements, the CRC verifier can determine if a symbol or group of bits is indicative of a bit error in the data packet and indicate the bit error to a higher-level entity, such as the Bluetooth protocol stack 126 or one of the Bluetooth profiles 124. This is but one example implementation of the CRC verifier 134, the implementations and uses of which vary and are described throughout the disclosure.

Each of peer devices 104 includes a peer-device processor 136 (peer processor 136) and peer-device computer-readable storage media 138 (peer CRM 138). The peer processor 136 can be any suitable type of processor, either single-core or multi-core, for executing instructions or code associated with applications, firmware, or an operating system of the peer device 104. The peer CRM 138 may include any type and/or combination of suitable storage media, such as RAM, non-volatile RAM (NVRAM), ROM, or Flash memory useful to store data of applications and/or an operating system of the peer device 104. In the context of the disclosure, the peer CRM 138 is implemented as storage media, and thus does not include transitory signals or carrier waves. In this example, peer applications 140 of the peer device 104 are embodied on the peer CRM 138. Although not shown, the peer CRM 138 may also include instances of services, Bluetooth profiles, or a Bluetooth stack that are configured similarly to or differently from those embodied on the host device 102.

Each of the peer devices 104 also includes a Bluetooth transceiver 142 and antennas 144 for communicating with the host device 102 via the wireless connection 106 and/or with other wirelessly-enabled devices. Although shown as a combined entity, the Bluetooth transceiver 142 may be implemented as separate transmit and receive components that respectively support transmit and receive functionalities. Additionally, the Bluetooth transceiver 142 may also include an instance of a CRC verifier, which can be configured similar to or differently from the CRC verifier 134 of the host device 102. The Bluetooth transceiver 142 may include any suitable configuration of respective communication paths (e.g., transmit or receive chains) to support transmission or reception of data packets via the wireless connection 106. In some cases, functionalities of the Bluetooth transceiver 142 are managed or accessible through a communications controller or baseband processor. Front-end circuitry (not shown) of the peer device 104 couples or connects the Bluetooth transceiver 142 to the antennas 144 to facilitate various types of wireless communication. The antennas 144 may include an array of multiple antennas that are configured similar to or differently from each other.

Figure 2:
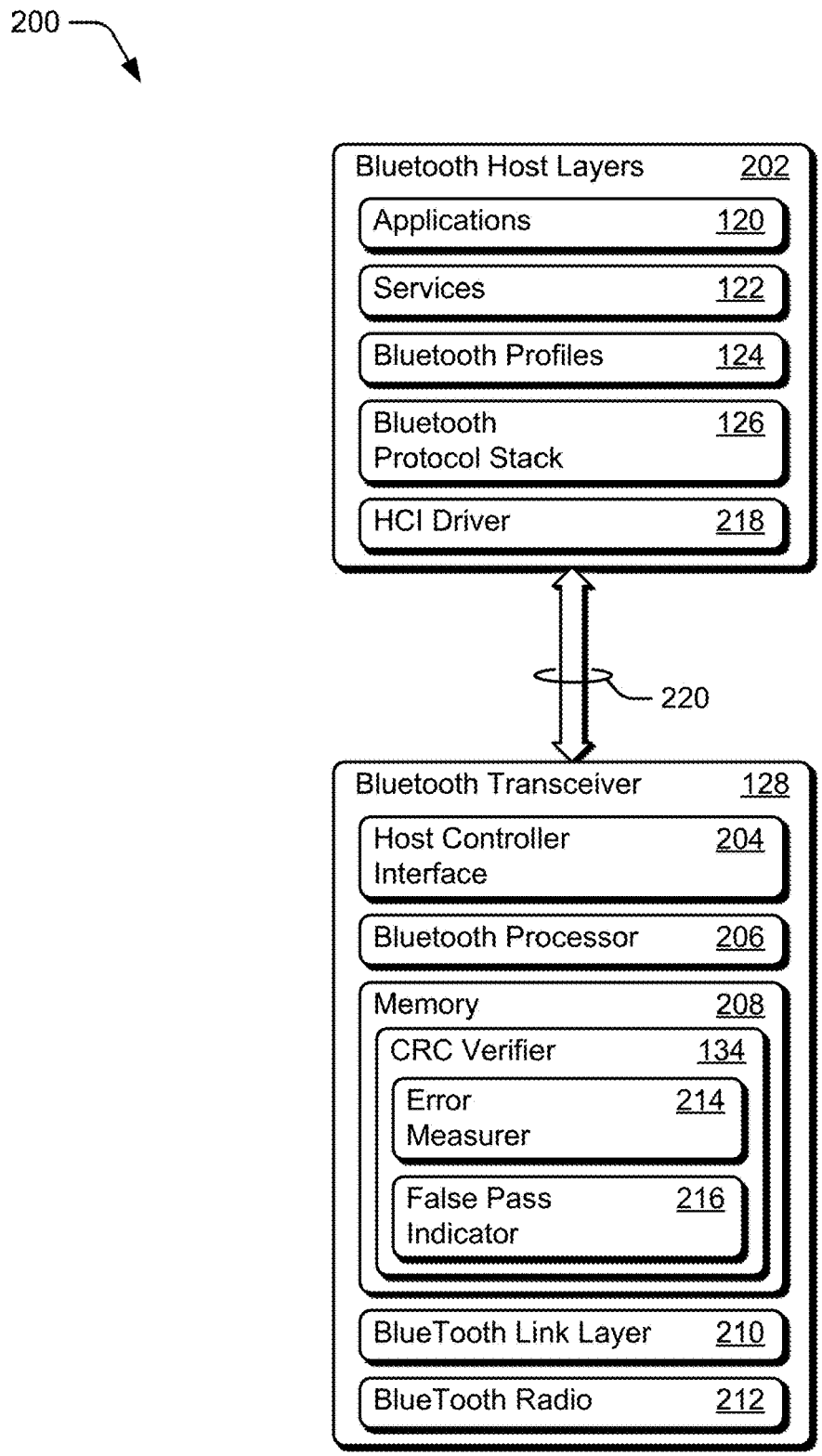
FIG. 2 illustrates example configurations of components of FIG. 1 that include an error measurer and false pass indicator in accordance with one or more aspects.

FIG. 2 illustrates example configurations and operations of the host device 102 components in accordance with one or more aspects, generally at 200. In this example, detailed aspects of the Bluetooth transceiver 128 and Bluetooth host layers 202 are described, though other types of wireless interfaces are also contemplated. Although described with reference to the host device 102, these configurations or operations can also be implemented in association with the Bluetooth transceiver 142 of a peer device 104. As such, aspects of phase-based CRC verification can be implemented by either or both of the host device 102 and peer devices 104 of the example environment 100.

In this example configuration, the Bluetooth transceiver 128 includes a Host Controller Interface 204 (HCI 204), a Bluetooth processor 206, memory 208, a link layer 210, and a Bluetooth radio 212. The HCI 204 provides a standardized communication interface between the Bluetooth host layers 202 and the Bluetooth transceiver 128. The Bluetooth processor 206 is configured to execute processor-executable instructions related to the operation of the Bluetooth transceiver 128, such as Bluetooth communication protocols. The memory 208 may include any suitable type and/or combination of storage media, such as read-only memory (ROM), random access memory (RAM), or Flash memory. The memory 208 may store firmware, an operating system, or applications of the Bluetooth transceiver 128 as instructions that are executed by the Bluetooth processor 206 to implement various functionalities of the Bluetooth transceiver 128. The link layer 210 controls how data is transferred over a link, such as controlling how data packets are encoded for transmission and received data packets are decoded. The link layer 210 may be implemented or configured to control data packet communication in accordance with any suitable Bluetooth protocol, such as BDR, EDR, BLE, or the like. The Bluetooth radio 212 controls how physical layer radio resources are controlled for transmission and reception of Bluetooth communications. The physical layer radio resources of the Bluetooth radio 212 include radio circuitry and logic for control of the radio circuitry.

In some aspects, the memory 208 includes processor-executable instructions for a CRC verifier 134, error measurer 214, and CRC false pass indicator 216 (false pass indicator 216). Generally, the CRC verifier 134 may access, receive information from, or transmit information to the error measurer 214 and CRC false pass indicator 216 to implement phase-based CRC verification for wireless communication. For example, the error measurer 214 may provide an error measurement for a symbol or group of bits of a data packet based on phase values for the symbol of the group of bits. These phase values may include any suitable type of phase value, such as a soft phase value, a sliced phase value, or a compensating signal phase value.

Based on error measurements provided by the error measurer 214, the CRC verifier 134 can determine whether a symbol, group of bits, or data packet include a bit error, which may have passed CRC operations. Alternately or additionally, the CRC verifier 134 can generate a bit value or signal via the false pass indicator 216 to alert or notify higher-level entities or stack layers that a data packet includes a bit error. In some aspects, this indication or notification of a false CRC pass for the data packet is effective to prevent a higher-level entity or stack layer from using the data packet that includes the bit error. The implementations and uses of the CRC verifier 134, error measurer 214, and false pass indicator 216 vary and are described throughout the disclosure.

The Bluetooth host layers 202 are applications and services generally configured as elements of a network stack architecture, such as in the Open Systems Interconnect (OSI) model. In this example, the Bluetooth host layers 202 include application 120, services 122, Bluetooth profiles 124, and a Bluetooth protocol stack 126, each of which may be implemented as described with reference to FIG. 1. The Bluetooth host layers 202 also include a Host Controller Interface driver 218 (HCI driver 218), through which data or commands are exchanged with the Bluetooth transceiver 128. Generally, the HCI driver 218 provides an interface to the HCI 204 for the Bluetooth protocol stack 126 of the Bluetooth host layers 202. The HCI 204 and the HCI driver 218 communicate via a data bus 220. The data bus 220 can be implemented using any suitable interconnection such as a serial interface, a parallel bus interface, a serial peripheral interface, a UART interface, and so forth.

The Bluetooth profiles 124 may include any suitable type of profile, such as an A2DP, ATTP, AVRCP, BIP, BPP, CIP, CTP, DIP, or the like. In various aspects, one or more of the Bluetooth profiles 124 receive data decoded from data packets that are received and processed by the Bluetooth transceiver 128. With phase-based CRC verification, an indication of a false CRC pass can be sent to a Bluetooth profile or other stack layer effective to prevent the profile or stack layer from attempting to use or process data from a data packet with a bit error. In at least some cases, this can be effective to prevent the Bluetooth profile or stack layer from entering an unrecoverable state due to the bit error, which may improve Bluetooth stack and/or profile performance.

Figure 3:
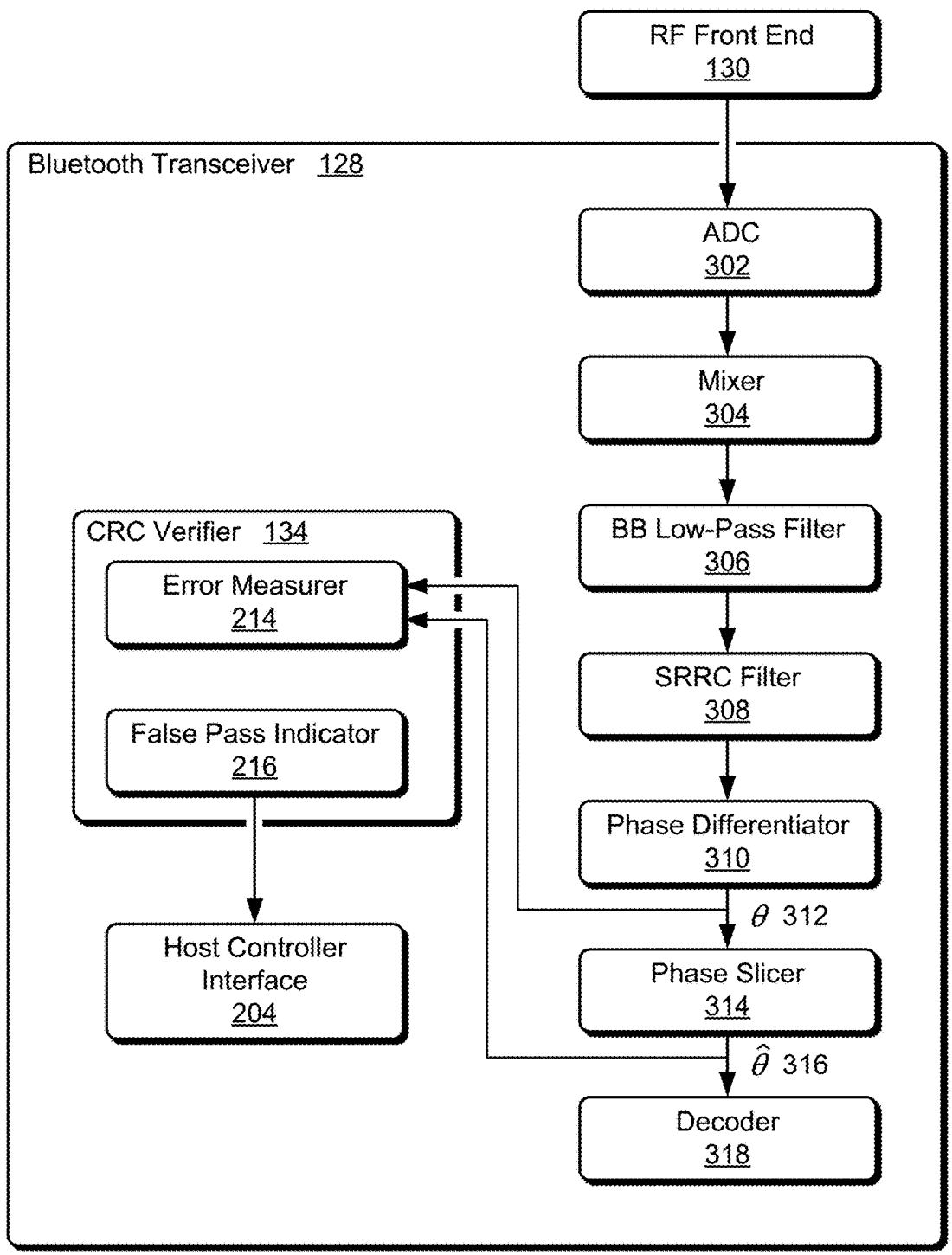
FIG. 3 illustrates an example configuration of a wireless transceiver that is capable of implementing aspects of phase-based CRC verification.

FIG. 3 illustrates an example configuration of a wireless transceiver that is capable of implementing aspects of phase-based CRC verification, generally at 300. In this example, detailed aspects of a Bluetooth transceiver 128 are described and include various components associated with a receive chain of the transceiver. This example configuration may be implemented for phase-based CRC verification of data packets communicated in accordance with an enhanced data rate (EDR) Bluetooth standard or protocol. Alternately or additionally, these configurations and/or operations can be implemented in association with the Bluetooth transceiver 142 of a peer device 104. As such, aspects of phase-based CRC verification can be implemented by either or both of the host device 102 and peer devices 104 of the example environment 100.

In this example, a receive chain of the Bluetooth transceiver 128 includes an analog-to-digital converter 302 (ADC 302) that digitally samples an RF signal received via the RF front end 130. The RF signal may include any suitable number of data packets that are modulated and transmitted in accordance with a Bluetooth specification or data rate. For example, a RF signal may be modulated with Gaussian frequency-shift keying (GFSK) for communication in the basic data rate (BDR) mode in which an instantaneous bit rate may approach 1 Mbit/s. In other cases, the RF signal is modulated with differential phase-shift keying (DPSK), such as π/4-DPSK and 8DPSK schemes, for communication in the enhanced data rate (EDR) mode at approximately 2 Mbit/s and 3 Mbit/s respectively. Accordingly, the receive chain of the Bluetooth transceiver 128 is configurable to demodulate and decode data packets of these RF signals to provide data for the host device 102.

A mixer 304 of the Bluetooth transceiver 128 down-converts the digitally sampled RF signal to provide a baseband Bluetooth signal. To filter the baseband signal, the Bluetooth transceiver 128 includes a baseband low-pass filter 306 (BB low-pass filter 306) and a square-root-raised-cosine filter 308 (SRRC filter 308). The SRRC filter 308 provides filtered signal samples to the phase differentiator 310, which may be implemented as a circuit or module implemented through the execution of instructions. The phase differentiator 310 is configured to determine a soft phase value 312 (θ 312) for a signal sample or information symbol of a data packet received by the Bluetooth transceiver 128.

The phase differentiator 310 provides the soft phase value 312 (e.g., angle difference from a constellation phase point) to a phase slicer 314 and the error measurer 214 of the CRC verifier 134. The phase slicer 314 of the Bluetooth transceiver 128 may be implemented as a circuit or module implemented through the execution of instructions. Generally, the phase slicer 314 slices signal samples at a number of equally spaced phases or angles to determine a sliced phase value 316 ($\hat{\theta}$ 316) that correlates signal constellation phase points of a transmitted symbol (unless there is a symbol error). The phase slicer 314 is configured to provide the sliced phase value 316 to a decoder 318 and the error measurer 214 of the CRC verifier 134. The decoder 318 of the Bluetooth transceiver 128 can decode or process the signal samples to obtain information symbols.

In some aspects, the error measurer 214 is configured to provide an error measurement for a symbol of a data packet based on the soft phase value 312 and the sliced phase value 316. Based on multiple respective error measurements for the symbols of a data packet, the CRC verifier 134 detects or determines whether the data packet includes a bit error. The CRC verifier 134 can cause the false pass indicator 216 to generate a signal quality bit or signal that is transmitted to the host controller interface 204. By so doing the signal quality bit can be passed to higher-level entities (e.g., stack layers) effective to prevent these higher-level entities from processing or using data with bit errors.

Figure 4:
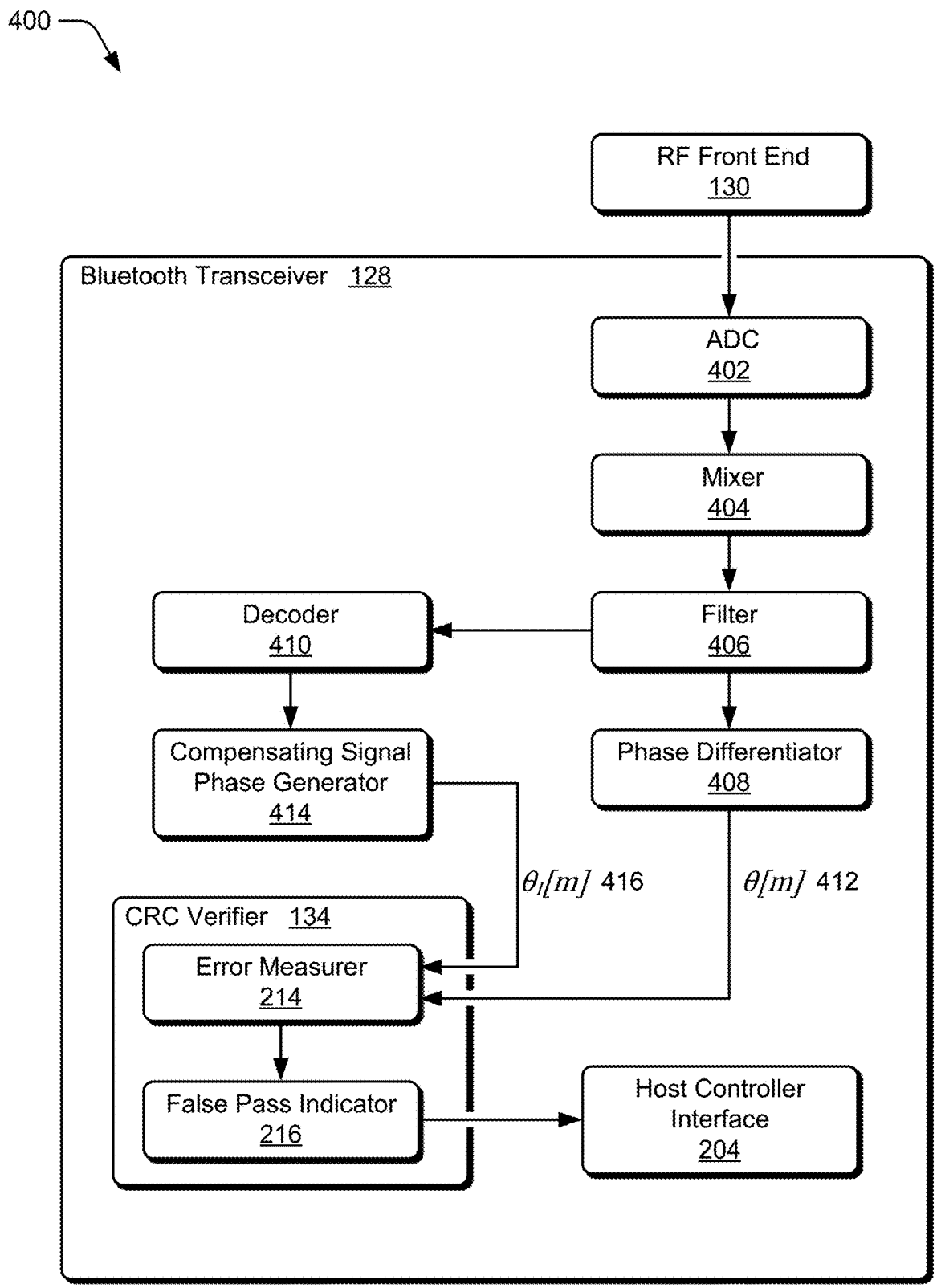
FIG. 4 illustrates another example configuration of a wireless transceiver that is capable of implementing aspects of phase-based CRC verification.

FIG. 4 illustrates another example configuration of a wireless transceiver that is capable of implementing aspects of phase-based CRC verification, generally at 400. In this example, detailed aspects of a Bluetooth transceiver 128 are described and include various components associated with a receive chain of the transceiver. This example configuration may be implemented for phase-based CRC verification of data packets communicated in accordance with a basic data rate (BDR) Bluetooth or Bluetooth Low-Energy (BLE) standard or protocol. Alternately or additionally, these configurations and/or operations can be implemented in association with the Bluetooth transceiver 142 of a peer device 104. As such, aspects of phase-based CRC verification can be implemented by either or both of the host device 102 and peer devices 104 of the example environment 100. The components described with reference to FIG. 4 may be implemented similar to or differently from corresponding components that are described with reference to FIG. 3.

In this example, a receive chain of the Bluetooth transceiver 128 includes an ADC 402 that digitally samples a RF signal received via the RF front end 130. The RF signal may include any suitable number of data packets that are modulated and transmitted in accordance with a Bluetooth specification or data rate. For example, a RF signal may be modulated with Gaussian frequency-shift keying (GFSK) for communication in the basic data rate (BDR) mode in which an instantaneous bit rate may approach 1 Mbit/s. Alternately or additionally, the RF signal may be referred to as a signal modulated with continuous phase modulation (CPM) or a CPM signal. Accordingly, the receive chain of the Bluetooth transceiver 128 is configurable to demodulate and decode data packets of these RF signals to provide data for the host device 102.

A mixer 404 of the Bluetooth transceiver 128 down-converts the digitally sampled RF signal to provide a baseband signal to a filter 406. The filter 406 may include a low-pass filter or a pulse shaping filter that is configured to filter out abrupt changes in the phase of the received baseband signal, thereby leading to a smooth transition of phase of the baseband signal. The filter 406 filters the baseband signal or signal samples and provides filtered signal samples to a phase differentiator 408 and a decoder 410. The phase differentiator 408 is configured to determine a phase value 412 (θ[m] 412) for signal sample m or information symbol of a data packet received by the Bluetooth transceiver 128. The phase differentiator 408 provides the phase values 412 (e.g., phase value for a group of bits) to the error measurer 214 of the CRC verifier 134, which is configured to determine or compute error measurements (e.g., error vector magnitude (EVM)) based on the phase values 412.

The decoder 410 of the Bluetooth transceiver 142 receives the filtered baseband signal from the filter 406 and is configured to obtain information symbols by decoding samples of the filtered baseband signal. The decoder 410 provides the information symbols to a compensating signal phase generator 414 and/or to a baseband processor for further processing to extract data of the data packet. The compensating signal phase generator is configured to generate compensating signal phase values 416 ($\theta_f[m]$ 416) based on information symbols decoded from the baseband signal. The compensating signal phase generator provides the compensating signal phase values 416 or an indication of these values to the error measurer 214 of the CRC verifier 134.

In some aspects, the error measurer 214 is configured to provide an error measurement (e.g., error vector magnitude) for a group of bits of a data packet based on a phase value 412 and a compensating signal phase value 416. Based on multiple respective error measurements for groups of bits (e.g., 4-6 bits) of a data packet (e.g., 336 bits), the CRC verifier 134 detects or determines whether the data packet includes a bit error. The CRC verifier 134 can cause the false pass indicator 216 to generate a signal quality bit or signal that is transmitted to the host controller interface 204. By so doing the signal quality bit can be passed to higher-level entities (e.g., stack layers) effective to prevent these higher-level entities from processing or using data with bit errors.

Techniques of Phase-Based CRC Verification

Figure 7:
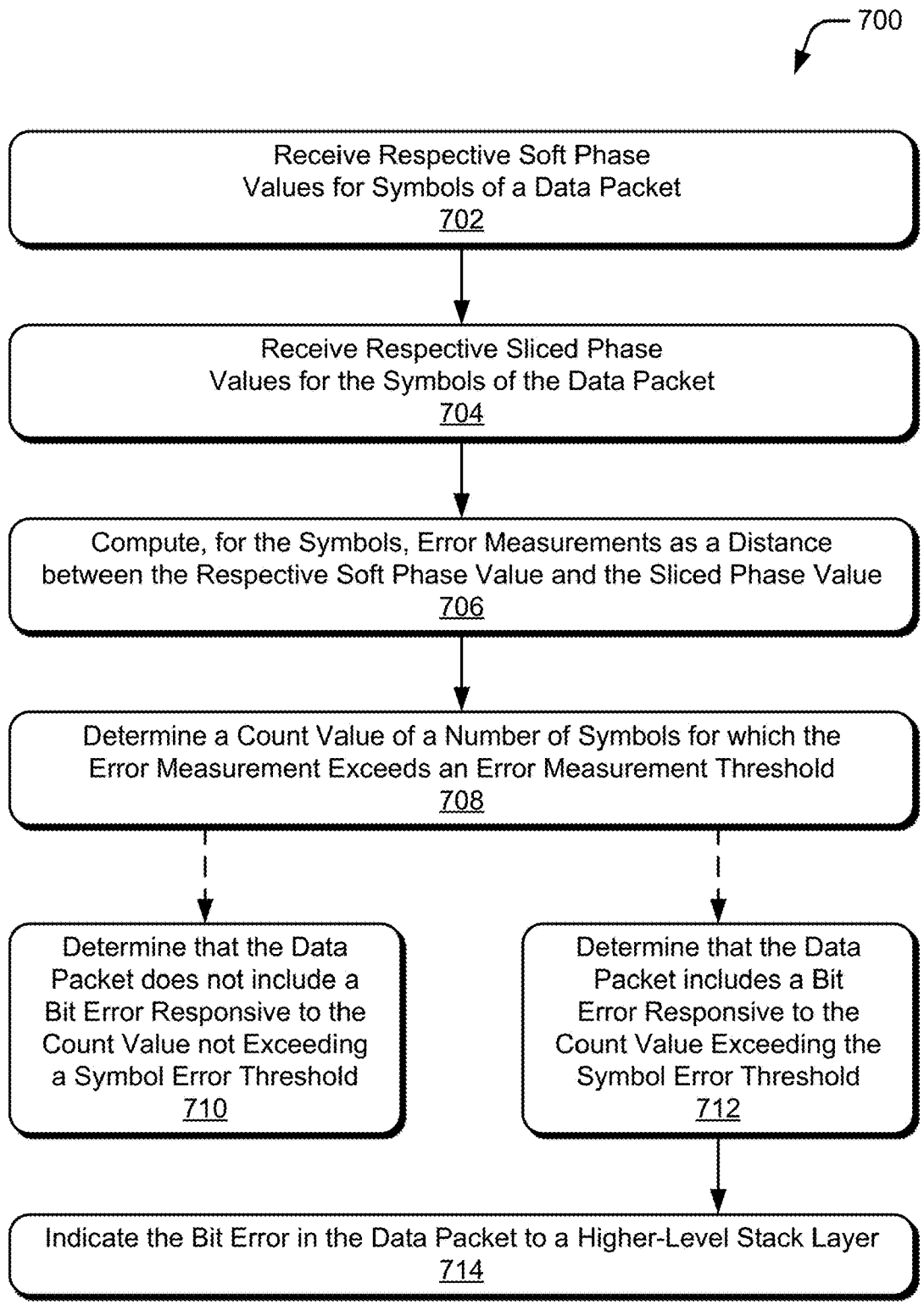
FIG. 7 illustrates an example method for determining whether a data packet includes a bit error in accordance with one or more aspects.
Figure 8:
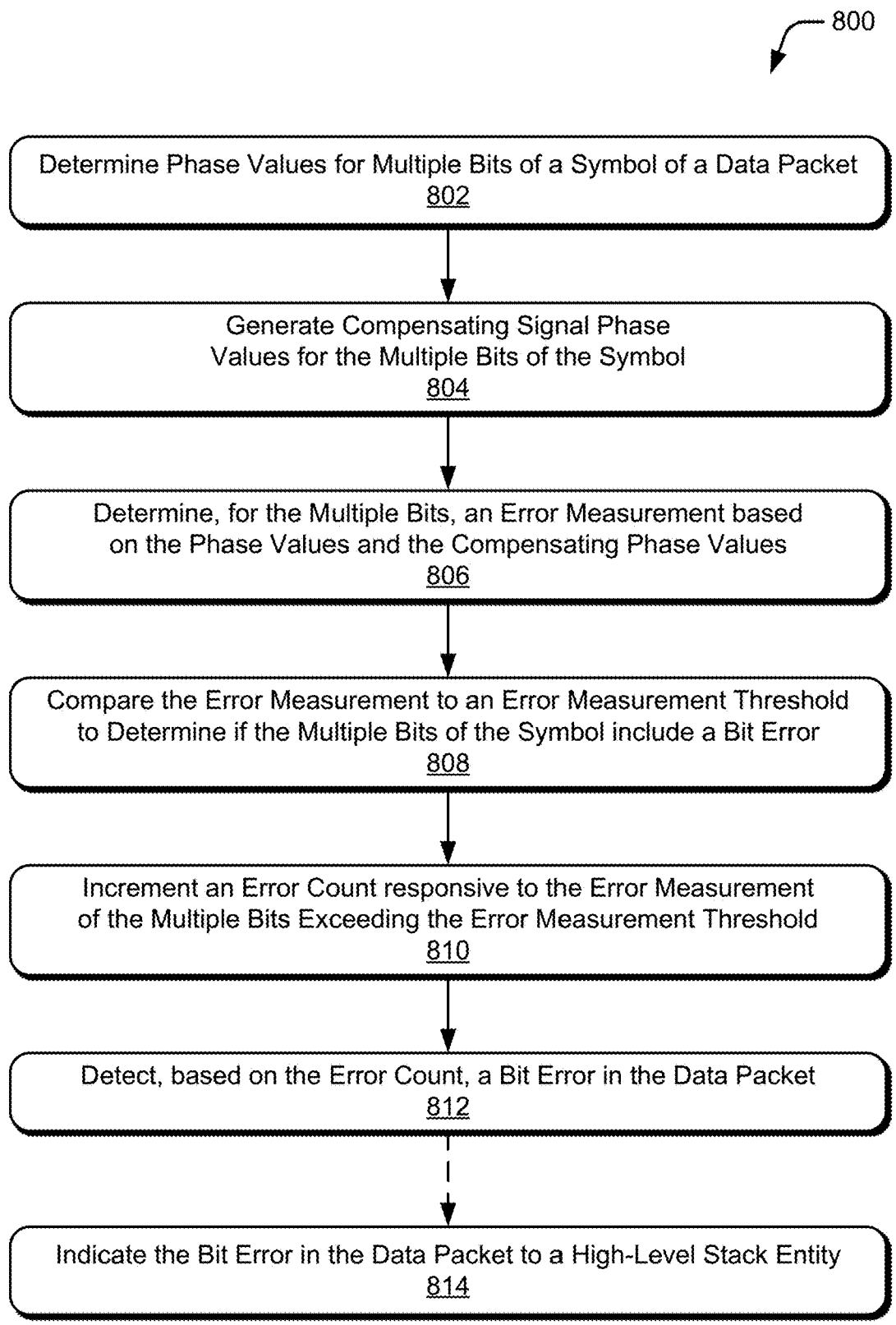
FIG. 8 illustrates an example method for implementing phase-based CRC verification for multiple bits of a data packet.

The following discussion describes techniques of phase-based cyclic redundancy check (CRC) verification for wireless communication. These techniques can be implemented using any of the environments and entities described herein, such as a CRC verifier 134, error measurer 214, and/or false pass indicator 216 of a host device 102. Alternately or additionally, the techniques can be implemented using a CRC verifier 134, error measurer 214, and/or false pass indicator 216 embodied on a peer device 104. Although described with reference to Bluetooth communication, the techniques or operations described may be implemented with other types of wireless interfaces or communication protocols. These techniques include methods that are illustrated in FIGS. 5, 7, and 8 each of which is shown as a set of operations performed by one or more entities.

The illustrated methods are not necessarily limited to the orders or combinations of operations shown in the Figures. Rather, any of the operations may be repeated, omitted, substituted, or re-ordered to implement various aspects described herein. Further, these methods may be used in conjunction with one another, in whole or in part, whether performed by the same entity, separate entities, or any combination of the entities. In portions of the following discussion, reference will be made to the operating environment 100 of FIG. 1 and the components of FIGS. 2-4 by way of example. Such reference is not intended to be limiting any of the described aspects to the operating environment 100 or example transceiver/component configurations, but rather as illustrative of one of a variety of examples.

Figure 5:
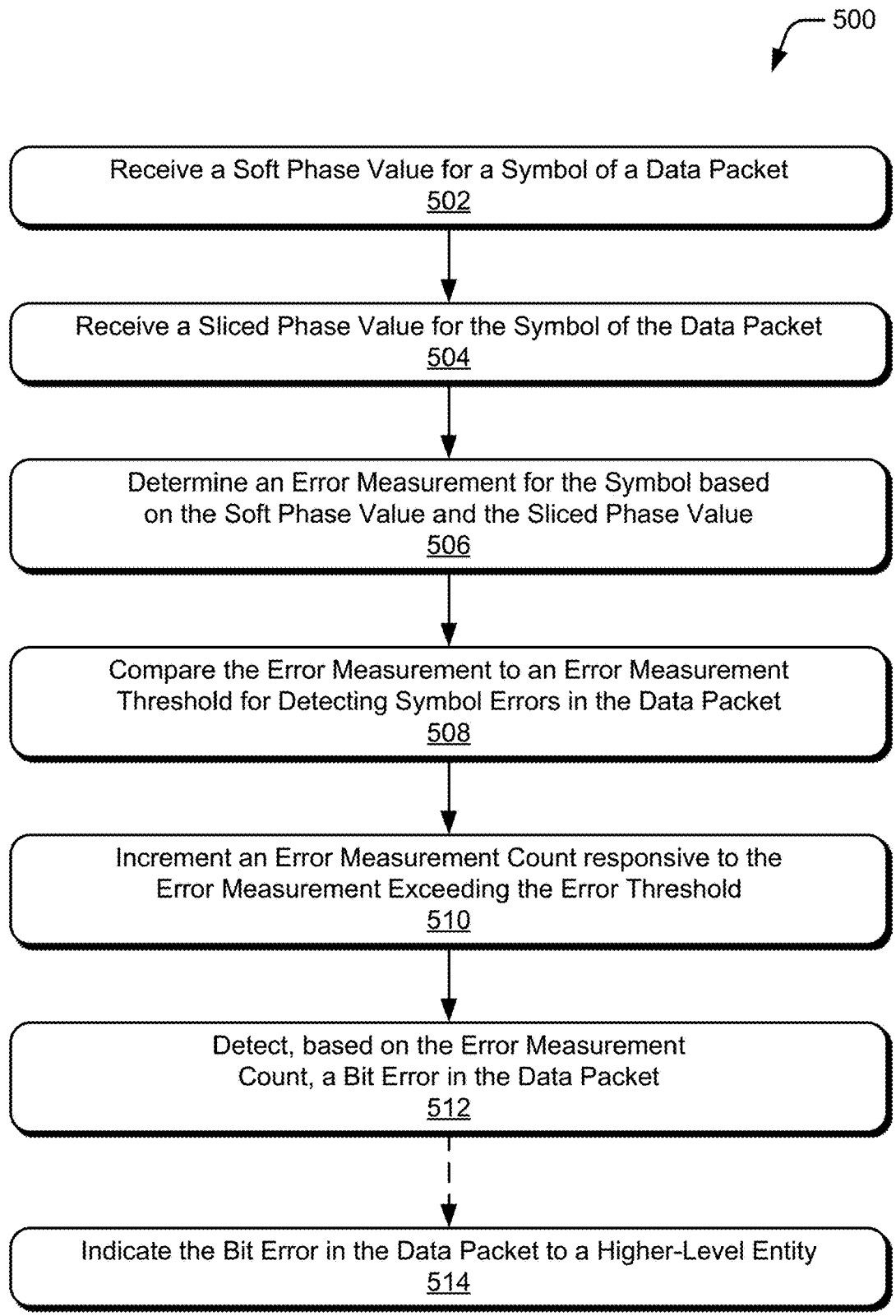
FIG. 5 illustrates an example method for detecting bit errors in a data packet based on symbol phase in accordance with one or more aspects.

FIG. 5 depicts an example method 500 for detecting bit errors in a data packet based on symbol phase in accordance with phase-based CRC verification, including operations performed by the CRC verifier 134, error measurer 214, and/or false pass indicator 216.

At 502, a soft phase value for a symbol of a data packet is received. The soft phase value may include a phase of a received soft symbol provided by a symbol mapper or decoder. In some cases, the soft phase value is received from a phase differentiator circuit of a Bluetooth transceiver or receive chain. By way of example, consider FIG. 6 which illustrates example constellation mappings for enhanced data rate (EDR) Bluetooth modulation schemes, generally at 600. With respect to the EDR 3 Mbps constellation 602, a soft phase value 604 (θ 604) for a symbol is received by an error measurer from a phase differentiator circuit. Here, note that the soft phase value 604 does not align with the constellation phase point 606 of $-\frac{1}{2}\pi$ in the 3 Mbps constellation 602. Another example is provided with reference to an EDR 2 Mbps constellation 608 in which a soft phase value 610 (θ 610) is received for a symbol of a data packet. The EDR 2 Mbps constellation 608 includes fewer constellation phase points, and the soft phase value 610 does not align with the constellation phase point 612 of $-\frac{1}{2}\pi$ in the 2 Mbps constellation 608.

Figure 6:
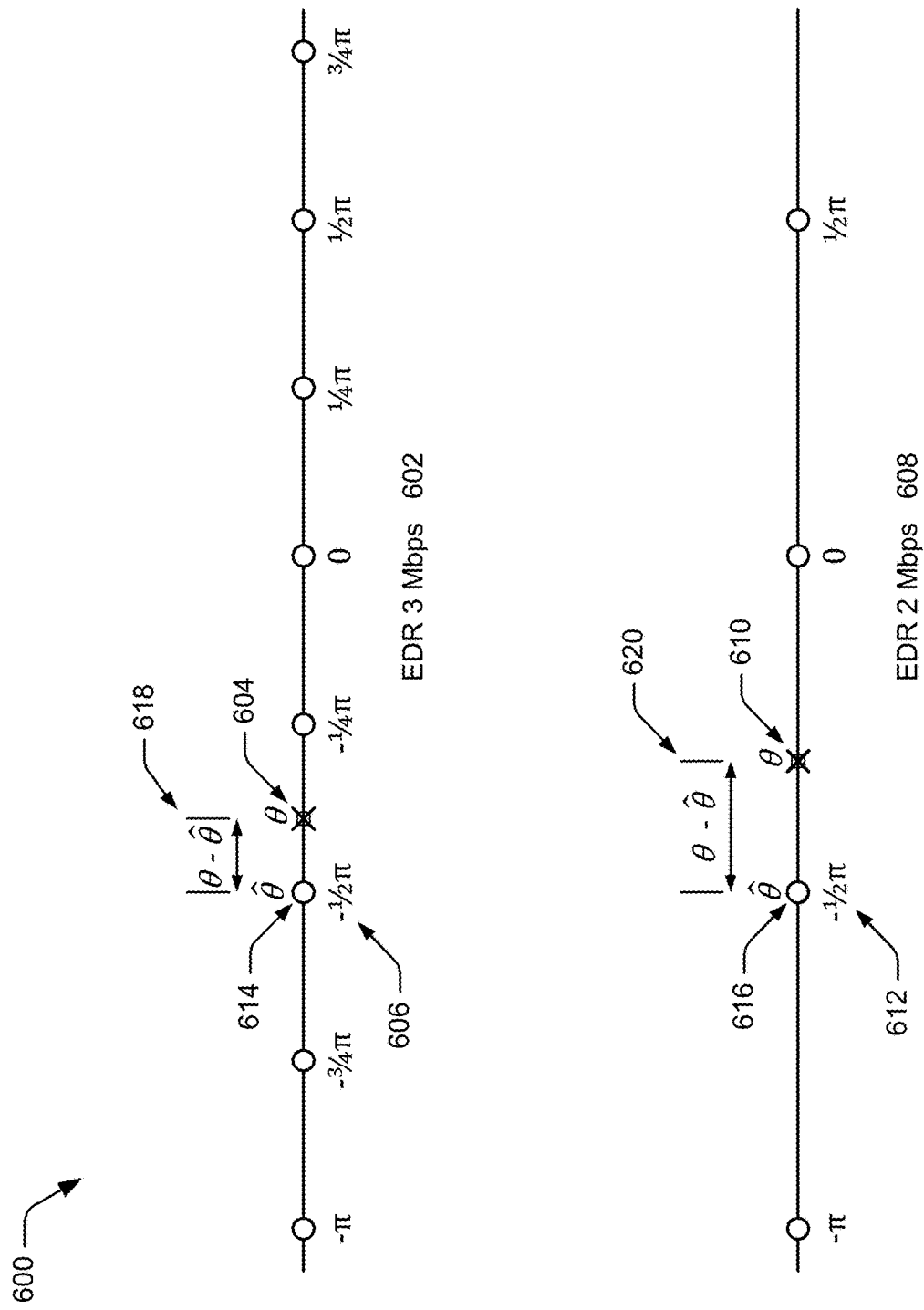
FIG. 6 illustrates examples of error measurements for symbols modulated in accordance with an enhanced data rate communication protocol.

At 504, a sliced phase value for the symbol of the data packet is received. The sliced phase value for the symbol may match or align with a phase point of a signal constellation by which the symbol was modulated. For example, the sliced phase value of the symbol may match a phase point of a corresponding EDR signal constellation. In the context of the present example, the error measurer receives a sliced phase value 614 (θ 614) from a phase slicer of a Bluetooth transceiver. As shown in FIG. 6, the sliced phase value 614 matches or aligns with the constellation phase point 606 of $-\frac{1}{2}\pi$ in the 3 Mbps constellation 602. For the EDR 2 Mbps constellation 608, a sliced phase value 616 (θ 616) is received from a phase slice and matches the constellation phase point 612 of $-\frac{1}{2}\pi$ in the 2 Mbps constellation 608.

At 506, an error measurement for the symbol is determined based on the soft phase value and the sliced phase value. The error measurement may include an error vector magnitude computed as a distance between phase of the received soft symbol and the sliced phase value of the symbol. In some cases, the error measurement is determined or computed for all symbols of a data packet. Alternately, the error measurement may be computed until an error threshold is exceeded for a data packet. Continuing the ongoing example, the error measurer computes an error measurement for the symbols of data packets received in accordance with EDR 3 Mbps and EDR 2 Mbps. As shown in FIG. 6 and with reference to the EDR 3 Mbps constellation 602, an error measurement 618 is computed as a distance between the soft phase value 604 and the sliced phase value 614. Additionally, an error measurement 620 is computed as a distance between the soft phase value 610 and the sliced phase value 616 for the symbol of the 2 Mbps data packet.

At 508, the error measurement is compared to an error measurement threshold for detecting symbol errors in the data packet. For the symbol and other symbols of the data packet, the respective error measurement (EM) of the symbol is compared to the error measurement threshold (e.g., badEM_threshold). In some cases, the error measurement threshold is configured to determine or enable a determination of whether the data packet includes a bit error, such as one associated with the symbol. The error measurement threshold can be configurable, such that a user or other authorized entity can alter or adjust the error measurement threshold. For example, the error measurement threshold can be set by a Bluetooth transceiver manufacturer based on trial or experimental results. Once deployed, the user or firmware of the Bluetooth transceiver can adjust the error measurement threshold based on conditions (e.g., noise, distance, multipath, co-located radio interference) of an environment in which the Bluetooth transceiver is operating. In the context of the present example, the error measurer or a CRC verifier of the Bluetooth transceiver compares the error measurement 618 to an error measurement threshold.

At 510, an error measurement count in incremented responsive to the error measurement exceeding the error threshold. In some cases, the error measurement count (or symbol error count) is tracked relative a total number of symbols of the data packet for which an error measurement is calculated. For example, a number of instances for which an error measurement of a symbol exceeds the threshold can be tracked as "X" and a number of instances for which error measurements are computed can be tracked as "N". Alternately or additionally, a total number of symbols in the data packet can also be tracked or counted during CRC verification. Continuing the ongoing example, the CRC verifier of the Bluetooth transceiver increases a measurement error count responsive to the error measurement of a symbol (of either example scenario) exceeding an error measurement threshold of the CRC verifier.

At 512, a bit error is detected in the data packet based on the symbol error count. Alternately, a bit error can be detected responsive to an error measurement of a symbol exceeding the error measurement threshold, e.g., provided at operation 508. The bit error may be detected based on a count of instances for which error measurements of data packet symbols exceed the error measurement threshold. In some cases, the error measurement count for a data packet (X) is divided by a number of symbols in the data packet for which an error measurement is determined (N) to provide a quotient value (X/N) indicative of symbol errors for the data packet. This quotient value or error measurement ratio of the packet can be compared to threshold configured to enable detection of bit errors in the data packet (e.g., average_badEM_threshold).

This data packet-level threshold (or bit-error threshold) can also be configurable, such that a user or other authorized entity can alter or adjust the threshold. For example, the threshold can be set by a Bluetooth transceiver manufacturer based on trial or experimental results. Once deployed, the user or firmware of the Bluetooth transceiver can adjust the threshold based on conditions (e.g., noise, distance, multipath, co-located radio interference) of an environment in which the Bluetooth transceiver is operating. In the context of the present example, the CRC verifier of the Bluetooth transceiver detects an error for a data packet based on an error measurement count for the data packet exceeding an average error measurement threshold for the data packet. As such, the CRC verifier has detected a bit error in a data packet that may have passed CRC operations and have a false CRC pass indication associated with the data packet.

Optionally at 514, the bit error in the data packet is indicated to a higher-level entity. The bit error may be indicated via a signal line or as a bit associated with the data packet, such as a signal quality bit or packet quality bit indicating that the data packet includes a bit error. The indication may be made to any suitable entity, such as to, or through, a host controller interface, a host control interface driver, a protocol stack, a profile associated with the transceiver, or a service associated with the transceiver. In some cases, this is effective to prevent the data packet with the bit error from compromising operation of the higher-level entity. Alternately or additionally, the data packet can be discarded before being forwarded to other layers of a Bluetooth stack of the device. Concluding the present example, the CRC verifier of the Bluetooth transceiver indicates the bit error to a Bluetooth profile via a signal quality bit that is associated with the data packet or includes an indication useful to identify the data packet that includes the bit error. The data packet can then be discarded, and in some cases, the Bluetooth transceiver may request re-transmission of the data that included the bit error.

FIG. 7 depicts an example method 700 for determining whether a data packet includes a bit error in accordance with one or more aspects, including operations performed by the CRC verifier 134, error measurer 214, and/or false pass indicator 216.

At 702, respective soft phase values are received for symbols of a data packet. The soft phase values may include phase of received soft symbols provided by a symbol mapper or decoder. In some cases, the soft phase values are received from a phase differentiator circuit of a Bluetooth transceiver or receive chain. The symbols of the data packet may be modulated in accordance with any suitable specification or data rate, such as Bluetooth EDR 3 Mbps or Bluetooth EDR 2 Mbps.

At 704, respective sliced phase values are received for the symbols of the data packet. The sliced phase values for the symbols may match or align with a phase point of a signal constellation by which the symbols were modulated. For example, the sliced phase values of the symbols may match respective phase points of a corresponding EDR signal constellation.

At 706, error measurements are computed for the symbols as a distance between the respective soft phase value and the respective sliced phase value for a given symbol. The error measurements may include error vector magnitudes (EVMs) computed as the distance between phases of received soft symbols and the sliced phase values of the symbols. In some cases, respective error measurements are computed or determined for all symbols of the data packet. Alternately, the error measurements may be computed for the symbols until an error threshold is exceeded for a data packet.

At 708, a count value is determined for a number of symbols for which the error measurement exceeds an error measurement threshold. In some cases, the count value (or symbol error count) is tracked relative a total number of symbols of the data packet for which an error measurement is calculated. For example, a number of instances for which an error measurement of a symbol exceeds the threshold can be tracked as count value "X" and a number of instances for which error measurements are computed can be tracked as instance count "N". Alternately or additionally, a total number of symbols in the data packet can also be tracked or counted during CRC verification.

At 710, a determination is made that the data packet does not include a bit error in response to the count value not exceeding a symbol error threshold. For example, if a number of instances for which the error measurement exceeds the error measurement threshold is not greater than a packet-level threshold for bit error detection, the CRC may determine that the packet does not include a bit error.

At 712, a determination is made that the data packet does include a bit error in response to the count value exceeding the symbol error threshold. The bit error may be detected based on the count value of instances exceeding a packet-level or average threshold for detecting bit errors. In some cases, the count value for a data packet (X) is divided by a number of symbols in the data packet for which an error measurement is determined (N) to provide an EM ratio (X/N) indicative of symbol errors or bit errors for the data packet. The error measurement ratio of the packet can be compared to threshold configured to enable detection of bit errors in the data packet (e.g., average_badEM_threshold). Alternately or additionally, the data packet-level threshold (or bit-error threshold) can also be configurable, such that a user or other authorized entity can alter or adjust the threshold.

At 714, the bit error in the data packet is indicated to a higher-level stack layer. The bit error may be indicated via a signal line or as a bit associated with the data packet, such as a signal quality bit or packet quality bit indicating that the data packet includes a bit error. The indication may be made to any suitable stack layer, such as to, or through, a host controller interface, a host control interface driver, a protocol stack layer, or a Bluetooth profile. In some cases, this is effective to prevent the data packet with the bit error from compromising operation of the higher-level layer.

FIG. 8 depicts an example method 800 for implementing phase-based CRC verification for multiple bits of a data packet, including operations performed by the CRC verifier 134, error measurer 214, and/or false pass indicator 216.

At 802, phase values for multiple bits of a symbol in a data packet are determined. The phase values may be determined using a phase differentiator that is configured to determine phase values (θ[m]) for signal samples of a baseband signal. In some cases, the phase differentiator determines the phase values for the multiple bits or bit groups based on signal samples or a baseband signal received from a filter component of a Bluetooth transceiver. The multiple bits or bit groups may include any suitable number of bits, such as from three to eight bits of the data packet. The data packet may comprise any suitable length or duration of data packet, such as from 336 microseconds (or 336 bits) to three milliseconds for BDR, BLE, and/or other Bluetooth specifications.

At 804, compensating signal phase values are generated for the multiple bits of the symbol of the data packet. The compensating signal phase values may be generated by a compensating signal phase generator that is configured to generate compensating signal phase values ($\theta_I[m]$) based on information symbols decoded from the baseband signal. By way of example, a compensating signal phase generator as described throughout the related U.S. Pat. No. 9,699,011 may be implemented to generate or provide the compensating signal phase values as described with reference to operations of the method 800. In some cases, the compensating signal phase value of a sample m is determined for an information symbol k over a window length w of (p+1).T, where p is a number of bits and T is a symbols duration.

At 806, an error measurement is determined for the multiple bits of the symbol based on the phase values and the compensating phase values. Here, an error measurement can be computed for a group of p multiple bits, of bit indexes p.bEM, p.bEM+1, p.bEM+2, p.bEM+3, . . . p.bEM+(p−1) with the compensating signal phase values provided form operation 806. In such a case, the compensating signal phase generator is set with information symbol k=p.$b_{EM}$ and number m=p+1, effective to look into a received signal as shown in equation 1.

Received signal y(t) from $kT < t \le (k+p+1)T$      Equation 1.

Using the compensating signal phase generator to generate compensating signal phase values $\theta_I[m]$ and the phase differentiator to determine phase values θ[m] for the window length of (p+1)T, the error measurement for the multiple bits can be computed as shown in equation 2, which Ns is a number of samples in signal time T.

$$\frac{1}{p \cdot N_s}\sum_{m=0}^{p \cdot N_s} |\theta_I[m] - \theta[m]|. \quad\quad \text{Equation 2}$$

At 808, the error measurement for the multiple bits is compared to an error measurement threshold to determine if the multiple bits of the symbol include a bit error. For the multiple bits and other bit groups of the data packet, the respective error measurement (EM) of the group of bits is compared to the error measurement threshold (e.g., badEM_threshold). In some cases, the error measurement threshold is configured to determine or enable a determination of whether the data packet includes a bit error, such as one associated with the multiple bits. The error measurement threshold can be configurable, such that a user or other authorized entity can alter or adjust the error measurement threshold. For example, the error measurement threshold can be set by a Bluetooth transceiver manufacturer based on trial or experimental results.

At 810, an error count in incremented responsive to the error measurement of the multiple bits exceeding the error threshold. In some cases, the error count (or bit group error count) is tracked relative a total number of bit groups of the data packet for which an error measurement is calculated. For example, a number of instances for which an error measurement of a bit group exceeds the threshold can be tracked as "X" and a number of instances for which error measurements of bit groups are computed can be tracked as "N".

At 812, a bit error is detected in the data packet based on the error count for the multiple bits (or multiple bit groups). Alternately, a bit error can be detected responsive to an error measurement of a bit group exceeding the error measurement threshold, e.g., provided at operation 808. The bit error may be detected based on a count of instances for which error measurements of bit groups exceed the error measurement threshold. In some cases, the error measurement count for a bit group is divided by a number of bit groups in the data packet for which an error measurement is determined (N) to provide a quotient value (X/N) indicative of bit group errors for the data packet. This quotient value or error measurement ratio of the packet can be compared to threshold configured to enable detection of bit errors in the data packet (e.g., average_badEM_threshold). This data packet-level threshold (or bit-error threshold) can also be configurable, such that a user or other authorized entity can alter or adjust the threshold.

Optionally at 814, the bit error in the data packet is indicated to a higher-level entity. The bit error may be indicated via a signal line or as a bit associated with the data packet, such as a signal quality bit or packet quality bit indicating that the data packet includes a bit error. The indication may be made to any suitable entity, such as to, or through, a host controller interface, a host control interface driver, a protocol stack, a profile associated with the transceiver, or a service associated with the transceiver.

System-on-Chip

Figure 9:
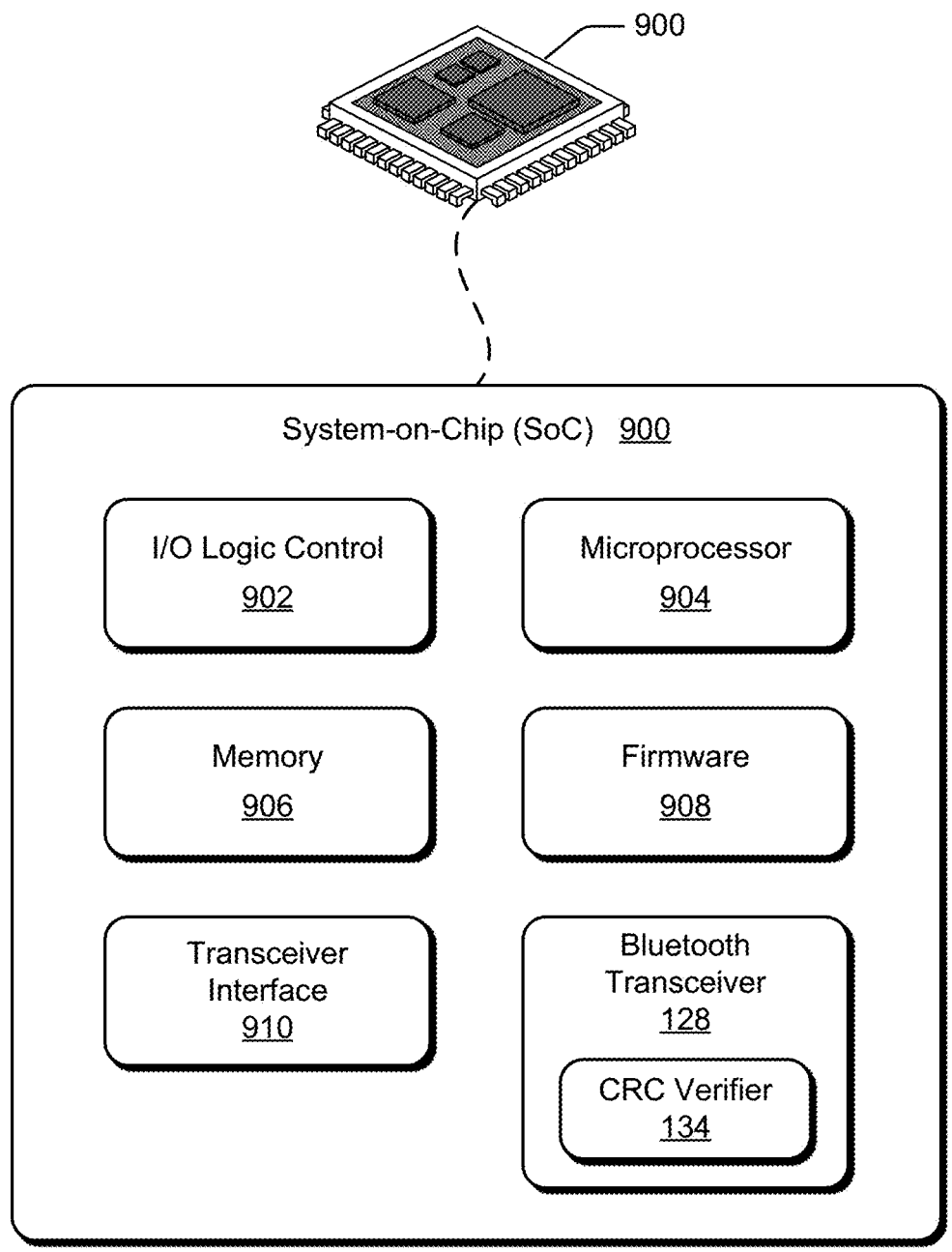
FIG. 9 illustrates an example System-on-Chip (SoC) environment for implementing aspects of phase-based CRC verification for wireless communication.

FIG. 9 illustrates an exemplary System-on-Chip (SoC) 900 that can implement various aspects of phase-based CRC verification for wireless communication. The SoC 900 can be implemented in any suitable device, such as a set-top box, gaming console, smart-phone, cellular phone, vehicle-based computing system, drone controller, mesh networking node, network-attached storage, netbook, tablet computer, access point, wireless router, camera, smart appliance, printer, medical device, Internet-of-Things (IoT) device, or any other suitable type of device. Although described with reference to a SoC, the entities of FIG. 9 may also be implemented as a network interface controller (NIC), application-specific standard part (ASSP), digital signal processor (DSP), programmable SoC (PSoC), or field-programmable gate array (FPGA). With reference to the devices described herein, the SoC 900 may be embodied in, or implement functionalities of, a CRC verifier in a host device 102 or peer device 104 in accordance with one or more aspects of phase-based CRC verification.

The SoC 900 can be integrated with electronic circuitry, a microprocessor, memory, input-output (I/O) logic control, communication interfaces, other hardware, firmware, and/or software useful to provide functionalities of a device, such as any of the devices listed herein. The SoC 900 may also include an integrated data bus (not shown) that couples the various components of the SoC for data communication between the components. The integrated data bus or other components of the SoC 900 may be exposed to or enable access of external components, such as for wireless communication. For example, the SoC 900 may be implemented as a baseband processor or modem for managing or controlling a transceiver or other hardware to communicate over a wireless medium.

In this example, the SoC 900 includes various components such as input-output (I/O) logic control 902 (e.g., to include electronic circuitry) and a microprocessor 904 (e.g., any of a microcontroller, processor core, application processor, or DSP). The SoC 900 also includes memory 906, which can be any type and/or combination of RAM, SRAM, DRAM, low-latency nonvolatile memory, ROM, one-time programmable (OTP) memory, and/or other suitable electronic data storage. In the context of this disclosure, the memory 906 stores data, instructions, or other information via non-transitory signals, and does not include carrier waves or other transitory signals. In some aspects, the microprocessor 904 and memory 906 are implemented as hardware-based components that are configurable to execute processor-executable instructions to implement functionalities or operations described throughout the disclosure.

Alternately or additionally, the SoC 900 may comprise a data interface (not shown) for accessing additional or expandable off-chip memory, such as external SRAM or flash memory. In some cases, the SoC 900 includes various applications, operating systems, and/or software, such as firmware 908, which can be computer-executable instructions maintained by the memory 906 and executed by the microprocessor 904. In this example, the SoC 900 includes a transceiver interface 910 for controlling or communicating with components of a local or off-chip wireless transceiver. Generally, the transceiver interface 910 may be implemented with or to control components, such as the Bluetooth transceiver 128, to facilitate communication between devices of a wireless network.

The SoC 900 also includes a Bluetooth transceiver 128 and CRC verifier 134, which may be embodied as disparate or combined components, as described in relation to aspects presented herein. Alternately or additionally, the SoC 900 may be implemented with another type of wireless transceiver, such as a WLAN or cellular transceiver. Although not shown, the SoC 900 or the CRC verifier 134 may also include an error measurer 214 and false pass indicator 216 to implement various aspects of phase-based CRC verification. Examples of these components and/or entities, and their corresponding functionality, are described with reference to the respective components of the environment 100 shown in FIG. 1 and various transceivers shown in FIGS. 2-4. Further, although described with reference to components of a host device 102, an SoC 900 may also be implemented as and with components of a peer device 104 of the environment 100 (e.g., Bluetooth transceiver 142). The CRC verifier 134, either in whole or part, can be implemented as processor-executable instructions (e.g., firmware 908) maintained by the memory 906 and executed by the microprocessor 904 to implement various aspects and/or features of phase-based CRC verification for wireless communication as described herein.

The CRC verifier 134, either independently or in combination with other entities, can be implemented with any suitable combination of components or circuitry to implement various aspects and/or features described herein. The CRC verifier 134 may also be provided integral with other entities of the SoC 900, such as integrated with the microprocessor 904, a network interface controller, or the transceiver interface 910 the SoC 900. Alternately or additionally, the CRC verifier 134 and the other components can be implemented as hardware, firmware, fixed logic circuitry, or any combination thereof.

Although the subject matter has been described in language specific to structural features and/or methodological operations, it is to be understood that the subject matter defined in the appended claims is not necessarily limited to the specific features or operations described herein, including orders in which they are performed.

What is claimed is:

1. A method for detecting bit errors in data packets, the method comprising:
   receiving, from a remote entity and via a wireless medium, a data packet at a wireless transceiver;
   receiving, from a phase differentiator of the wireless transceiver, a soft phase value of a symbol of the data packet;
   receiving, from a phase slicer of the wireless transceiver, a sliced phase value of the symbol of the data packet;
   determining an error measurement for the symbol based on the soft phase value and the sliced phase value;
   comparing the error measurement for the symbol to an error measurement threshold for detecting bit errors in the data packet; and
   detecting a bit error in the data packet based on the error measurement for the symbol exceeding the error measurement threshold.

2. The method as recited in claim 1, wherein the error measurement for the symbol of the data packet is determined by measuring a distance between the sliced phase value of the symbol and the soft phase value of the symbol.

3. The method as recited in claim 1, further comprising:
   incrementing a symbol error count for the data packet responsive to the error measurement exceeding the error measurement threshold; and
   wherein the bit error in the data packet is detected responsive to the symbol error count exceeding a symbol error threshold for detecting bit errors in the data packet.

4. The method as recited in claim 1, further comprising:
   incrementing a symbol error count for the data packet responsive to the error measurement exceeding the error measurement threshold;
   dividing the symbol error count for the data packet by a number of symbols in the data packet for which an error measurement is determined to provide a quotient value indicative of symbol errors for the data packet; and
   wherein the bit error in the data packet is detected responsive to the quotient value exceeding a symbol error threshold for detecting bit errors in the data packet.

5. The method as recited in claim 4, wherein:
   the symbol error threshold for detecting a bit error in the data packet is a configurable threshold; or
   the symbol error threshold for detecting bit errors in the data packet is an average-based threshold useful to detect the bit error in the data packet.

6. The method as recited in claim 1, further comprising indicating the bit error in the data packet to a higher-level entity associated with the wireless transceiver.

7. The method as recited in claim 6, wherein indicating the bit error comprises setting a bit associated with signal quality of the data packet.

8. The method as recited in claim 7, further comprising:
performing a cyclic redundancy check (CRC) on the data packet;
determining that the data packet passes the CRC; and
indicating a CRC pass to the higher-level entity of the wireless transceiver.

9. The method as recited in claim 6, wherein the bit error in the data packet is indicated to one of a host controller interface, a host control interface driver, a protocol stack, a profile associated with the wireless transceiver, or a service associated with the wireless transceiver.

10. A System-on-Chip (SoC) comprising:
a wireless communication controller configured to receive data packets;
a receive chain configured to process the data packets and comprising a phase differentiator circuit and a phase slicer circuit; and
a cyclic redundancy check (CRC) verifier implemented at least partially in hardware and configured to:
receive, from the phase differentiator circuit, a soft phase value of a symbol of a data packet;
receive, from the phase slicer circuit, a sliced phase value of the symbol of the data packet;
determine an error measurement for the symbol based on the soft phase value and the sliced phase value;
compare the error measurement for the symbol to an error measurement threshold for detecting bit errors in the data packet; and
detect a bit error in the data packet based on the error measurement for the symbol exceeding the error measurement threshold.

11. The SoC as recited in claim 10, wherein the CRC verifier is further configured to measure a distance between the sliced phase value of the symbol and the soft phase value of the symbol to determine the error measurement for the symbol.

12. The SoC as recited in claim 10, wherein the CRC verifier is further configured to:
increment a symbol error count for the data packet responsive to the error measurement exceeding the error measurement threshold; and
detect the bit error in the data packet responsive to the symbol error count exceeding a symbol error threshold for detecting bit errors in the data packet.

13. The SoC as recited in claim 10, wherein the CRC verifier is further configured to:
increment a symbol error count for the data packet responsive to the error measurement exceeding the error measurement threshold;
divide the symbol error count for the data packet by a number of symbols in the data packet for which an error measurement is determined to provide a quotient value indicative of symbol errors for the data packet; and
detect the bit error in the data packet responsive to the quotient value exceeding a symbol error threshold for detecting bit errors in the data packet.

14. The SoC as recited in claim 10, wherein the CRC verifier is further configured to indicate the bit error in the data packet to a higher-level entity associated with the wireless communication controller.

15. The SoC as recited in claim 14, wherein the wireless communication controller is further configured to:
perform a CRC on the data packet;
determine that the data packet passes the CRC; and
indicate a CRC pass of the data packet to the higher-level entity associated with the wireless communication controller.

16. The SoC as recited in claim 10, wherein the wireless communication controller is configured to communicate in accordance with an institute of Electrical and Electronics Engineer (IEEE) 802.15 standard or a Bluetooth Special Interest Group (SIG) specification.

17. A non-transitory computer-readable storage media comprising instructions that, responsive to execution by a hardware-based processor, implement a cyclic redundancy check (CRC) verifier to:
receive, from a phase differentiator of a wireless transceiver, a soft phase value of a symbol of a data packet, the data packet received via a wireless medium;
receive, from a phase slicer of the wireless transceiver, a sliced phase value of the symbol of the data packet;
determine an error measurement for the symbol based on the soft phase value and the sliced phase value;
compare the error measurement for the symbol to an error measurement threshold for detecting bit errors in the data packet; and
detect a bit error in the data packet based on the error measurement for the symbol exceeding the error measurement threshold.

18. The non-transitory computer-readable storage media as recited in claim 17, wherein the CRC verifier is further implemented to measure a distance between the sliced phase value of the symbol and the soft phase value of the symbol to determine the error measurement for the symbol of the data packet.

19. The non-transitory computer-readable storage media as recited in claim 17, wherein the CRC verifier is further implemented to: increment a symbol error count for the data packet responsive to the error measurement exceeding the error measurement threshold; and detect the bit error in the data packet responsive to the symbol error count exceeding a symbol error threshold for detecting bit errors in the data packet.

20. The non-transitory computer-readable storage media as recited in claim 19, wherein the CRC verifier is further implemented to indicate the bit error in the data packet to a higher-level entity associated with the wireless transceiver.

* * * * *